(12) United States Patent
Oprescu (10) Patent No.: US 7,420,491 B2
(45) Date of Patent: *Sep. 2, 2008

(54) ANALOG SIGNAL SAMPLING SYSTEM AND METHOD HAVING REDUCED AVERAGE INPUT CURRENT

(75) Inventor: Florin A. Oprescu, Rancho Santa Fe, CA (US)

(73) Assignee: Linear Technology Corp., Milpitas, CA (US)

( * ) Notice: Subject to any disclaimer, the term of this patent is extended or adjusted under 35 U.S.C. 154(b) by 98 days.

This patent is subject to a terminal disclaimer.

(21) Appl. No.: 11/477,159

(22) Filed: Jun. 27, 2006

(65) Prior Publication Data

US 2006/0244650 A1 Nov. 2, 2006

Related U.S. Application Data

(63) Continuation of application No. 11/252,387, filed on Oct. 17, 2005, now Pat. No. 7,088,280.

(51) Int. Cl.
*H03M 1/00* (2006.01)
(52) U.S. Cl. .................. 341/122; 341/143; 341/155
(58) Field of Classification Search .................. 341/155, 341/143, 172, 122, 161
See application file for complete search history.

(56) References Cited

U.S. PATENT DOCUMENTS

| | | | |
|---|---|---|---|
| 5,017,920 A | 5/1991 | French | |
| 5,107,266 A | 4/1992 | Kim | |
| 5,200,752 A | 4/1993 | Goetke | |
| 5,610,557 A | 3/1997 | Jett, Jr. | |
| 6,140,950 A | 10/2000 | Oprescu | |
| 6,169,506 B1 | 1/2001 | Oprescu et al. | |
| 6,411,242 B1 | 6/2002 | Oprescu et al. | |
| 6,639,526 B1 | 10/2003 | Mayes | |
| 6,734,817 B2 | 5/2004 | Naka et al. | |
| 6,741,192 B2 | 5/2004 | Murata et al. | |
| 6,744,394 B2 | 6/2004 | Liu et al. | |
| 6,762,707 B2 | 7/2004 | Wolf et al. | |
| 6,927,717 B1 | 8/2005 | Oprescu | |
| 7,088,280 B2 | 8/2006 | Oprescu | |
| 7,091,896 B2 | 8/2006 | Oprescu | |
| 2004/0001018 A1 | 1/2004 | Hales | |

OTHER PUBLICATIONS

"24-Bit No Latency ΔΣ™ ADC with Differential Input and Differential Reference," LTC2410 Data Sheet, Linear Technology Corporation, 2000.

"24-Bit High Speed 4-Channel ΔΣ ADC with Integrated Amplifier," LTC2442 Data Sheet, Linear Technology Corporation, 2005.

*Primary Examiner*—Peguy JeanPierre
(74) *Attorney, Agent, or Firm*—McDermott Will & Emery LLP (57) ABSTRACT

A novel sampling system having a sampling device responsive to an analog input signal and a reference signal for providing corresponding charges. A switching circuit is provided to supply the input signal and the reference signal to the sampling device. The switching circuit is controlled to supply the input signal and the reference signal to the sampling device so as provide a substantially zero total charge taken by the sampling device from a source of the input signal. One application of the foregoing is in analog-to-digital conversion.

8 Claims, 5 Drawing Sheets

ANALOG SIGNAL SAMPLING SYSTEM AND METHOD HAVING REDUCED AVERAGE INPUT CURRENT

This application claims priority of U.S. patent application Ser. No. 11/252,387 filed on Oct. 17, 2005, entitled "ANALOG SIGNAL SAMPLING SYSTEM AND METHOD HAVING REDUCED AVERAGE INPUT CURRENT," which is incorporated herein by reference.

RELATED APPLICATIONS

U.S. patent application Ser. No. 11/253,082, filed on Oct. 17, 2005, entitled "ANALOG SIGNAL SAMPLING SYSTEM AND METHOD HAVING REDUCED AVERAGE DIFFERENTIAL INPUT CURRENT" is incorporated herein by reference.

U.S. patent application Ser. No. 11/252,388, filed on Oct. 17, 2005, entitled "ANALOG-TO-DIGITAL CONVERTER WITH REDUCED AVERAGE INPUT CURRENT AND REDUCED AVERAGE REFERENCE CURRENT" is incorporated herein by reference.

TECHNICAL FIELD

This disclosure relates to circuitry and methodology for sampling an analog input signal to reduce an average charge taken from an input signal source, one application of which is in analog-to-digital (A/D) converters.

BACKGROUND ART

An exemplary but non-limiting application of the teachings presented herein is in signal sampling for A/D conversion. A typical analog-to digital converter samples an analog input signal in order to convert it into a corresponding digital signal. During this process, the converter loads the input signal and modifies it depending upon the impedance of the signal source. Such a modification directly influences the accuracy of the conversion process and the final result. For slower-speed and lower-resolution converters, errors caused by the input signal modification are insignificant and may be safely ignored.

On the other hand, recent developments in sensor technology, improvements in converter resolution and converter speed have made such errors quadratic factors limiting further increase in conversion accuracy. Moreover, the tendency to reduce power consumption and the expansion of portable applications has spread the use of a variety of sensors with relatively high source impedances. Examples of such sensors are high-value resistive bridges used to monitor weight and pressure.

At the same time, the development of the over-sampling converter technology has pushed the resolution of the analog-to-digital conversion to a 24-bit level and higher. Typical over-sampling converters use switched-capacitor front end circuits including one or more sampling capacitors to sample an analog input signal multiple times for each conversion cycle. During each sampling process, a certain amount of charge is transferred between the signal source and the converter front end capacitors resulting into an equivalent input current flow. As this input current passes through the signal source impedance, it causes a voltage change, modifying the original input value and creating a sampling error.

The value of the input current is directly proportional to the size of the sampling capacitors and to the sampling rate. Due to thermal noise limitations, an increase in the conversion resolution requires a quadratic increase in the size of the sampling capacitors resulting in the corresponding quadratic increase in the input current. At the same time, any increase in the overall conversion rate causes a proportional increase in the input signal sampling rate, resulting in the increased input current.

Two different strategies are typically used to deal with this problem. The first approach is to guarantee the complete settling (within the accuracy of the converter) of the front end sampling circuit including the input signal source impedance. This is a very difficult goal to achieve and it rapidly becomes impractical as the desired conversion accuracy and speed increase. The source impedance of a sensor imposes a theoretical limit on available ranges of conversion speed and resolution. Unavoidable parasitic capacitors and necessary signal filter capacitors involved in practical configurations further limit these ranges. An example of this approach is the LTC®2410 analog-to-digital converter developed by Linear Technology Corporation, assignee of the present subject matter.

The second approach uses isolation buffers and amplifiers interposed between the sensor and the converter. Such buffers can be external to the converter or may be integrated within the converter front end sampling circuits. Configurations using external buffers offer great flexibility but place an unacceptable heavy burden upon the user in order to maintain the global accuracy of the measurement chain. These configurations also demand supplemental power supply rails, critical power supply sequencing circuits and an additional physical space. Integrating the buffers within the converter front end sampling circuits partially resolves these issues. Nevertheless, the integrated buffers limit the analog-to-digital converter overall accuracy and dynamic range. An example of this approach is the LTC®2442 analog-to-digital converter developed by Linear Technology Corporation, assignee of the present subject matter.

Therefore, there is a need for a new sampling technique to reduce average input current taken from an input signal source.

SUMMARY OF THE DISCLOSURE

The present disclosure offers novel signal sampling system and methodology. In accordance with one aspect of the disclosure, a sampling system includes a sampling device responsive to an input signal and a reference signal for providing corresponding charges, and a switching circuit controllable to supply the input signal and the reference signal to the sampling device. The switching circuit is controlled to supply the input signal and the reference signal to the sampling device so as to provide a substantially zero total charge taken by the sampling device from a source of the input signal.

In exemplary applications of the principles taught herein to A/D conversion, the proposed sampling architecture significantly reduces the average charge taken from the input signal source without substantially altering the instantaneous charge transferred between the input source and a modulator. A charge storage device (e.g. A capacitor) can be connected at the converter input in order to supply this instantaneous charge as required by the modulator. In the same time the average current flowing through the internal resistance of the input signal source (e.g. The sensor) is minimal. Consequently the effect of the input source resistance upon the measurement accuracy is greatly diminished.

The proposed architecture is based upon the observation that certain types of over-sampling converters balance the charge transferred from the input signal with charge taken from the reference signal. Thus, by properly sequencing the input signal sampling sequence, charge is transferred to and from the input signal source such that the total net charge transfer is substantially zero.

In particular, a switching device may be coupled to terminals supplying an input signal and a pair of reference signals. The switching device may be controlled to provide a sampling device with the input signal and one of the reference signals in each sampling phase.

In accordance with an embodiment of the disclosure, the switching circuit may be controlled by a switch controller that may produce multiple control signals for controlling respective switches of the switching circuit.

A modulator, e.g., a delta-sigma modulator, may be coupled to the sampling device to produce a digital output signal. The modulator may comprise an integrator responsive to the charges produced by the sampling device, and an output device, such as a comparator, for producing the digital output signal having a value determined by the output signal of the integrator. The switch controller may produce a clock signal for controlling the output device of the modulator.

Among N sampling, $N_1$ sampling operations may result in a digital output signal having a first value, and $(N-N_1)$ sampling operations may result in the digital output signal having a second value. The switch controller may determine the number $N_1$ of sampling operations among the total number N of sampling operations, and control the switching circuit to make the number $N_1$ proportional to a ratio between the input signal and the reference signal.

In accordance with a method of the present disclosure the following steps may be carried out for sampling an input analog signal:

supplying a sampling device via a switching circuit with the input analog signal and a reference signal, and controlling the switching circuit to provide a substantially zero total charge taken by the sampling device from a source of the input signal. The switching circuit may be controlled during multiple successive sampling operations performed upon the input signal.

In accordance with another aspect of the present disclosure, a method of sampling an input signal includes the steps of:

determining number $N_1$ of sample sequences, in which a first reference signal should be supplied, among N sample sequences, supplying the input signal and the first reference signal in the $N_1$ sample sequences, and supplying the input signal and a second reference signal in $(N-N_1)$ sample sequences.

The number $N_1$ may be determined based on the output digital signal to minimize total charges taken from a source of the input signal. The output digital signal may have a first value in response to the $N_1$ sample sequences, and may have a second value in response to the $(N-N_1)$ sample sequences.

In accordance with another aspect of the disclosure, a system for reducing an average differential input current of a sampling circuit comprises a sampling device for sampling a differential analog input signal, and a switching circuit for supplying the differential input signal and a differential reference signal to the sampling device. The switching circuit is controlled during multiple sampling operations so as to provide a substantially zero total differential charge taken by the sampling device from a source of the differential input signal.

In accordance with an embodiment of the disclosure, the system may further include a differential-in/differential-out voltage amplifier responsive to an output signal of the sampling device to produce a differential output signal.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made using the example of an over-sampling analog-to-digital (A/D) converter. It will become apparent, however, that the concepts described herein are applicable to any type of circuit that implements sampling of analog signals.

Figure 1:
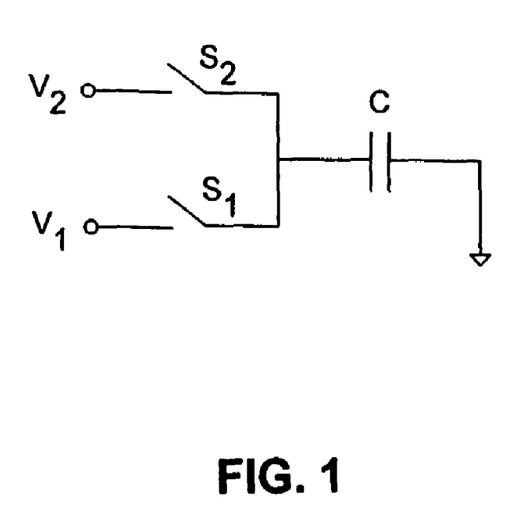
FIG. 1 is a diagram that illustrates the charge taken from an input signal source in a sample operation of the present disclosure.

The instantaneous charge required from an input signal source in any single sampling operation is proportional to the size of the sampling capacitors as well as to the amount of charge stored in these capacitors prior to the sampling operation. For example, as shown in FIG. 1, one terminal of a sampling capacitor C is connected to a reference voltage, e.g., to ground. The second terminal may be supplied through a switch $S_1$ with a voltage $V_1$ or through a switch $S_2$ with a voltage $V_2$. The voltages $V_1$ and $V_2$ are defined with respect to the established ground level.

Assuming that initially the switch $S_1$ is closed and the switch $S_2$ is open the charge $Q_1$ stored in the sampling capacitor C is:

$$Q_1 = V_1 * C$$

In the second phase, the switch $S_1$ is open and subsequently the switch $S_2$ is closed. At the end of this process the sampling capacitor C will have an accumulated charge $Q_2$:

$$Q_2 = V_2 * C.$$

During this sampling operation, the signal source $V_2$ provides a charge amount dQ which can be calculated as:

$$dQ = Q_2 - Q_1 = (V_2 - V_1) * C.$$

Figure 2:
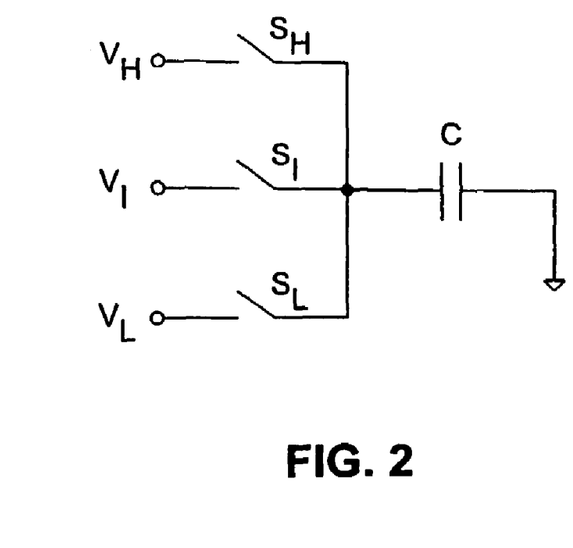
FIG. 2 is a diagram illustrating sampling of an input signal and a pair of reference signals in accordance with the present disclosure.

In another example, illustrated in FIG. 2, the sampling capacitor C has a first terminal connected to ground, and a second terminal supplied with an input voltage $V_I$ through the switch $S_I$, with a first reference voltage $V_L$ through the switch $S_L$, and with a second reference voltage $V_H$ through the switch $S_H$. At any given time only one of the three switches $S_L$, $S_I$ and $S_H$ is closed, while the remaining two are open.

A first sampling sequence of the input voltage $V_I$ starts with the switch $S_L$ closed in the first phase and continues with the switch $S_I$ closed in the second phase. The amount of charge $dQ_L$ taken from the input signal $V_I$ is:

$$dQ_L=(V_I-V_L)*C.$$

A second sampling sequence of the input voltage $V_I$ starts with the switch $S_H$ closed in the first phase and continues with the switch $S_I$ closed in the second phase. The amount of charge $dQ_H$ taken from the input signal $V_I$ in the second sampling sequence is:

$$dQ_H=(V_1-V_H)*C.$$

It may be assumed that in a set of N consecutive sample sequences of the input signal $V_I$, $N_1$ sample sequences are of a first type and the remaining $N_0=(N-N_1)$ sample sequences are of a second type. In particular, the first type of the sample sequences may be associated with supplying the reference voltage $V_H$, together with the input signal $V_I$, and the second type may be associated with supplying the reference voltage $V_L$, together with the input signal $V_I$. Therefore, the total charge $dQ_N$ taken from the input signal source $V_I$ during these N consecutive sample sequences is:

$$dQ_N=N_1*(V_I-V_H)*C+No*(V_I-V_L)*C$$

$$dQ_N=N_1*(V_I-V_H)*C+(N-N_1)*(V_I-V_L)*C$$

$$dQ_N=N*(V_I-V_L)*C-N_1*(V_H-V_L)*C$$

If the following condition is imposed:

$$VH>=VI>=VL \quad (1)$$

than N1 can be selected as the digital representation of the input signal VI with respect to the reference signal VH–VL with a resolution of N counts. This relation can be written as:

$$N1=N*(VI-VL)/(VH-VL) \quad (2)$$

Using this value of N1 in the above calculation of dQN we obtain:

$$dQN=0.$$

This result is independent of the order and succession of the two types of sample sequences within the set N.

The accuracy of this relation is limited by the quantization accuracy of the input signal VI with respect to the reference signal VH–VI within an N counts representation. Thus, while systems and methods according to the invention reduce the current drawn from the analog signal source to substantially zero, nevertheless, some current is drawn from the analog signal source. The amount of current drawn from the analog signal source is preferably within the limits set by the quantization accuracy of the input signal.

It has been shown that, within the limitations of (1) and using prior or concomitant knowledge of the magnitude of VI with respect to VH and VL as expressed by (2), the proposed strategy reduces significantly the average charge required from the input signal source. This reduction is proportional with the resolution of the digital representation of the input signal (2) and it is particularly useful in high resolution analog-to-digital converters.

Figure 3A:
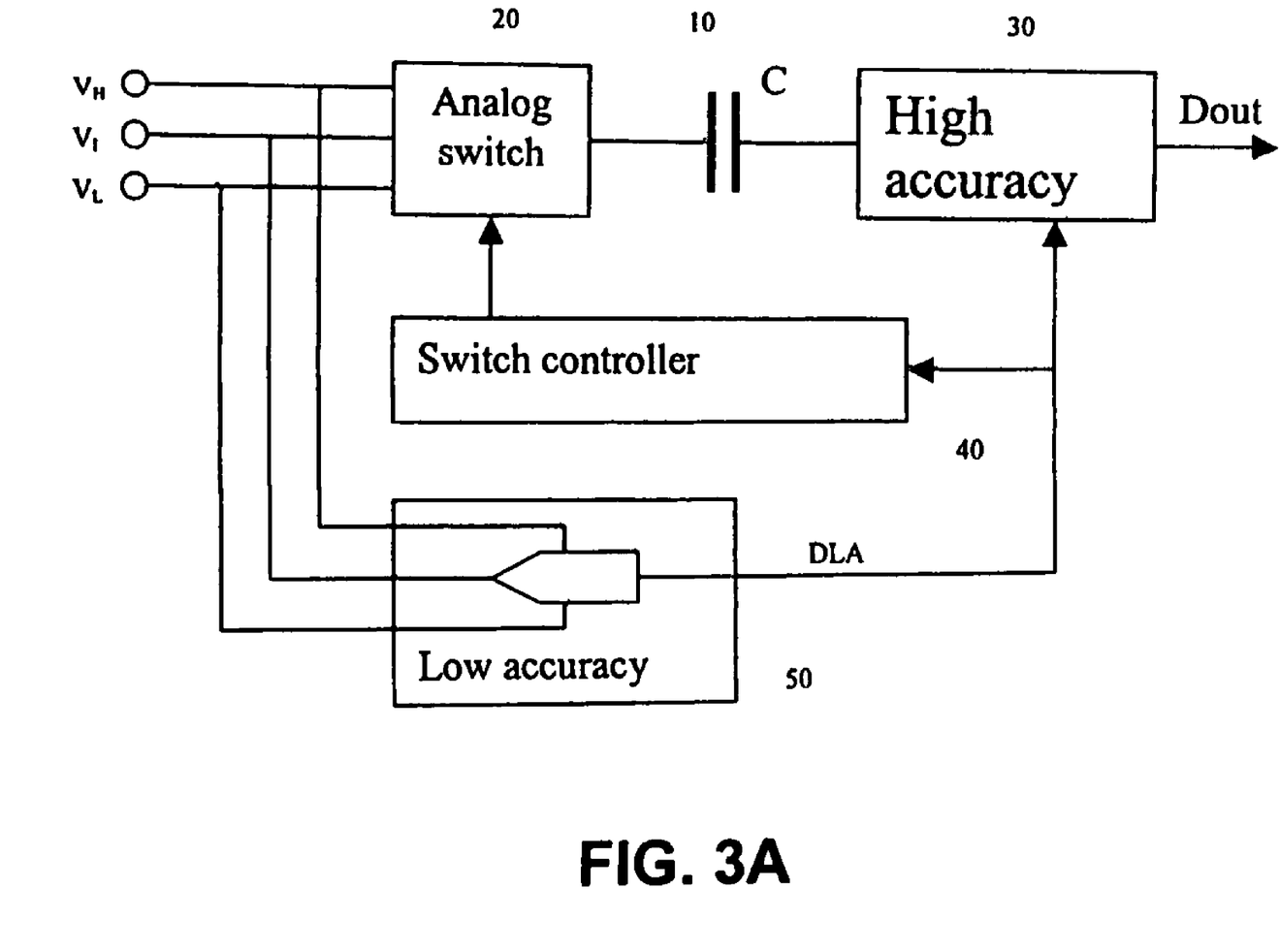
FIGS. 3A and 3B are diagrams illustrating A/D conversion arrangements of the present disclosure.

An immediate implementation of this proposal is shown in FIG. 3A. One terminal of the sampling capacitor #10 is connected to the input signal terminal VI and the reference signal terminals VH and VL through the analog switch block #20. The other terminal of the sampling capacitor #10 is connected to the "High accuracy converter" #30.

The magnitude of input signal VI is evaluated with respect to the reference signals VH and VL by the "Low accuracy ADC" #50. This converter can be implemented using a variety of well known analog-to-digital conversion techniques and, because of its relative low accuracy with respect to high-accuracy converter 30, it does not present a substantial load to the input signal VI. The analog-to-digital converter #50, using the input signal VI and the reference signals VH and VL produces an equivalent digital representation DLA of input signal VI. The digital signal DLA is a serial binary stream as described by equation (2) and has a resolution of N counts. Depending upon the conversion method used by the converter #50, this stream can be produced directly or converted from a parallel format through common digital techniques.

The DLA data stream is used by switch controller #40 to direct the operation of analog switch block #20. During each sample operation, the analog switch #20 connects the sampling capacitor #10 in two successive phases to one of the reference terminals VH and VL and to the input signal terminal VI. Switch controller #40, using the information contained in the digital data stream DLA, selects the appropriate sampling sequence such that the total charge taken from the VI signal source during the conversion process is substantially zero.

The "High accuracy" converter #30 uses the charge sampled on capacitor #10 during a minimum of N successive sampling steps together with the sampling sequence information contained in the DLA data stream to produce the output data Dout. Dout is a high accuracy representation of the input signal VI.

In the above description the "High accuracy" and "Low accuracy" are relative terms that relate directly to the different potential loadings of the input signal (corresponding to the larger capacitors required for higher accuracy resolution as described above) by the two converters. The terms "low accuracy" and "high accuracy" as defined herein are intended only to describe the relative relationship of the two analog-to-digital converters and are not intended to limit the scope of the invention, or of either of the converters, to any particular objective accuracy range.

The operation of converters #30 and #50 can be simultaneous and synchronized or converter #50 can produce its output at any time prior to the utilization of the output in the sampling process.

The implementation of analog-to-digital converters, sampling capacitors, analog switches and switch controllers is well known and widely described in the technical literature. The sampling capacitor, shown as a single device in FIG. 3a, may be in an actual implementation a set of capacitors which simultaneously perform the input and reference sampling operations required by the over-sampling converter as well as additional scaling and calibration functions. Similarly the analog switch may be implemented using multiple physical switches in various parallel and serial configurations supporting simultaneous sampling, scaling and calibration functions.

Furthermore a single "High accuracy" converter #30 may be connected to multiple sampling capacitors C and receive each of the respective corresponding data streams DLA where each capacitor and its corresponding "Low accuracy" converter producing the DLA samples a distinct input signal.

The converter #30 preferably combines each of the multiple capacitors respective charges in the analog domain and produces Dout as a digital representation of the ratio of the multiple input signals.

An over-sampling converter can greatly benefit from this sampling configuration being able to perform simultaneous the function of both converter #50 and converter #30 of FIG. 3A. During the conversion process such a converter samples the input signal N times (where N is the over-sample ratio) and generates a stream of digital data which is subsequently processed in order to obtain the conversion result. This stream of digital data contains information about the ratio between the input signal and the reference signal and such information can be used to control the sampling sequences in order to substantially reduce the average charge taken from the input signal source.

Figure 3B:
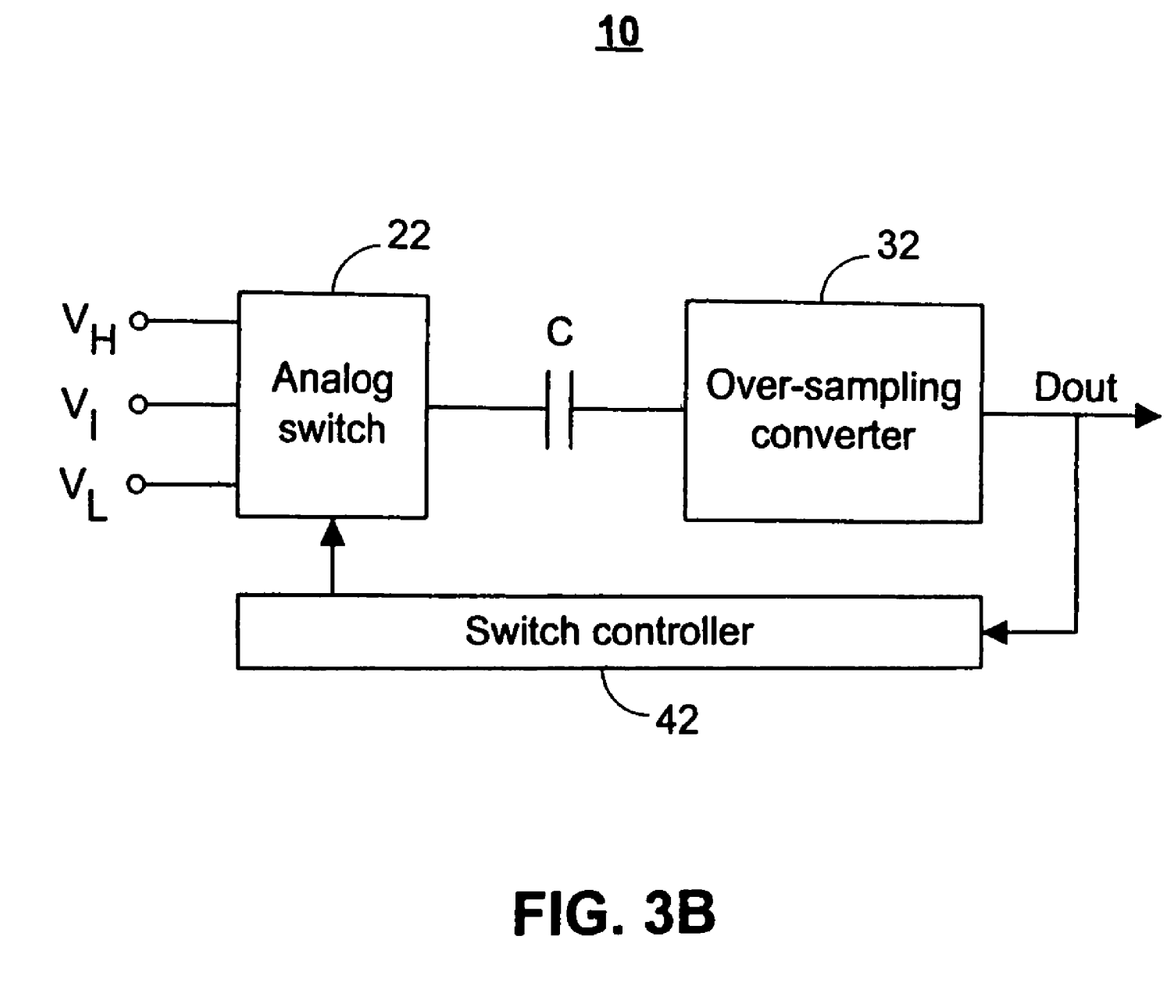

Another proposed configuration according to the invention is shown in FIG. 3B. FIG. 3B is a diagram illustrating components of an A/D converter 10 of the present disclosure that comprises an analog switch 22, a sampling capacitor C, an over-sampling converter 32 and a switch controller 42. The analog switch 22 connects one terminal of the sampling capacitor C to an input signal terminal $V_I$ and reference signal terminals $V_H$ and $V_L$. The other terminal of the sampling capacitor C is connected to the over-sampling converter 32.

A conversion cycle of the over-sampling converter 32 that produces an output data stream Dout consists of a set of N successive sample operations where N is the over-sampling ratio. The output data stream Dout, which is a digital representation of the ratio between the input signal and the reference signal, is supplied to the switch controller 42 to direct the operation of the analog switch 22. During each sample operation, the analog switch 22 connects the sampling capacitor C in two successive phases to one of the reference signal terminals $V_H$ and $V_L$ and to the input signal terminal $V_I$. The switch controller 42 uses the information contained in the digital data stream Dout to select the appropriate sampling sequence such that the total charge taken from the $V_I$ signal source is substantially zero.

One skilled in the art would realize that the analog switch 22, over-sampling converter 32, sampling capacitor C, and switch controller 42 may be implemented using various arrangements. For example, the sampling capacitor C may be represented by a set of capacitors which simultaneously perform the input and reference sampling required by the over-sampling converter as well as additional scaling and calibration functions. Similarly, the analog switch 22 may be implemented using multiple physical switches in various parallel and serial configurations supporting simultaneous sampling, scaling and calibration functions.

Figure 4:
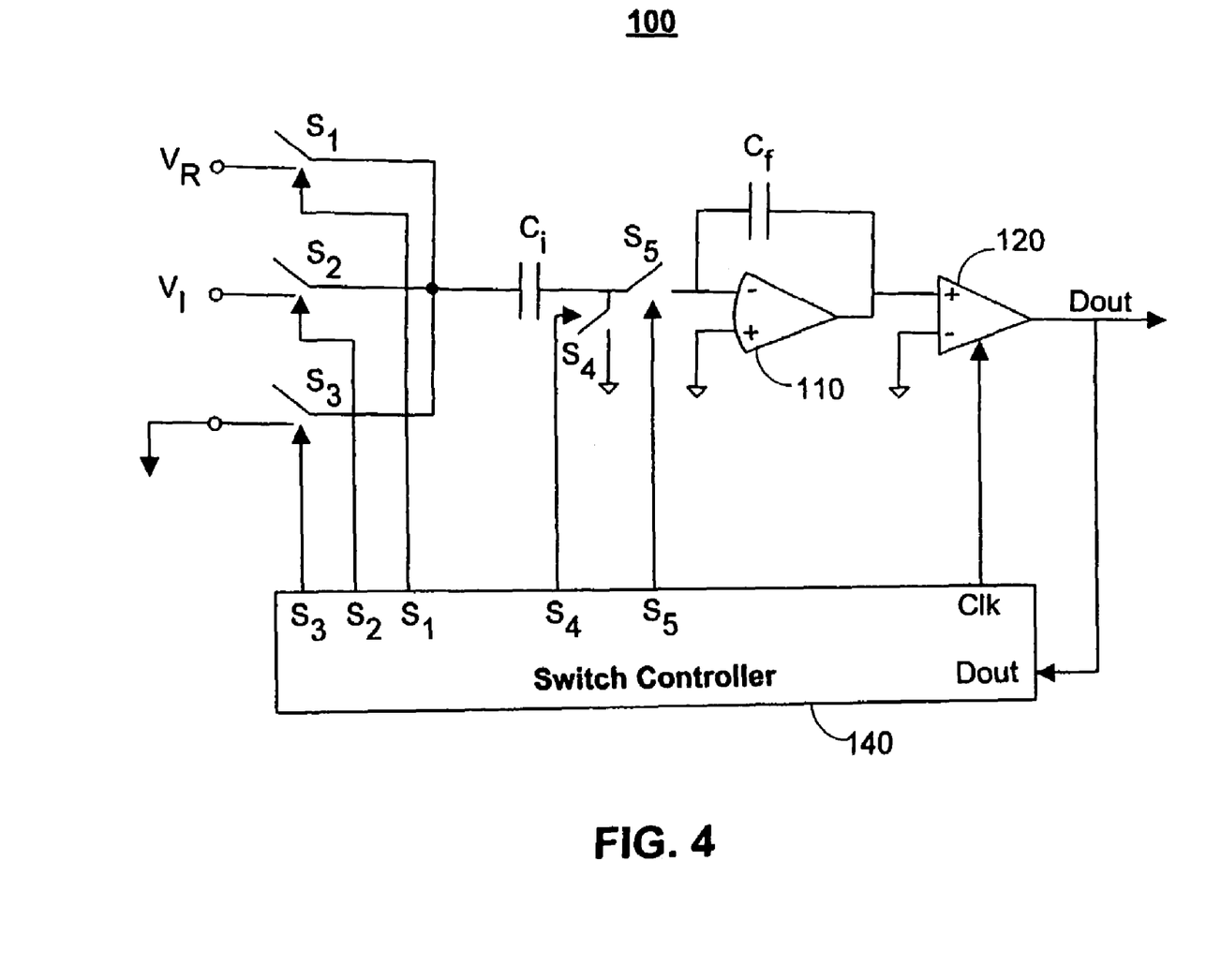
FIG. 4 is a diagram illustrating an embodiment of an A/D converter of the present disclosure.

An exemplary implementation of an A/D converter 100 of the present disclosure is shown in FIG. 4. The A/D converter 100 comprises a sampling capacitor $C_i$, a voltage amplifier 110 having an integrating capacitor $C_f$ in its feedback loop, a comparator 120, and a switch controller 140. An analog switch $S_1$ is provided for supplying a reference voltage $V_R$ to a first terminal of the sampling capacitor $C_i$. An analog switch $S_2$ is arranged for connecting an input voltage $V_I$ to the first terminal of the sampling capacitor $C_i$. For simplicity, a ground potential is selected as the second reference voltage ($V_L$=0). An analog switch $S_3$ connects this ground potential to the first terminal of the sampling capacitor $C_i$. Analog switches $S_4$ and $S_5$ are provided to connect a second terminal of the sampling capacitor $C_i$ to a ground terminal and the amplifier 110, respectively.

The integrating capacitor $C_f$, voltage amplifier 110, comparator 120 and analog switches $S_4$ and $S_5$ represent a first-order delta-sigma modulator. The amplifier 110, together with the capacitors $C_i$ and $C_f$, and the switches $S_4$ and $S_5$, represent a switched-capacitor implementation of an analog integrator. For simplicity of explanation, a ground potential is selected as common mode voltage references for the integrator and comparator circuits.

The output of the amplifier 110 is connected to the comparator 120 controlled by a clock signal Clk generated by an internal clock of the switch controller 140 to produce a single-bit output digital signal Dout. In particular, when the comparator 120 is triggered by the Clk signal, it produces output digital value Dout=1 if the output of the amplifier 110 is positive, and output value Dout=0 if the output of the amplifier 110 is negative.

The data signal Dout is used by the switch controller 140 to control operations of the first-order delta-sigma modulator. In particular, the switch controller 140 produces switch drive signals $S_1$ to $S_5$ for controlling the respective switches. Further, the data stream Dout may be processed by a digital filter (not shown) connected to the output of the comparator 120 to calculate the conversion result.

Based on the data signal Dout and an internal clock signal produced by the internal clock, the switch controller 140 controls the first-order delta-sigma modulator to maintain the total charge taken from the input signal source substantially zero for N consecutive sample operations of one conversion cycle.

Sampling operations of the A/D converter 100 are described below. Every pulse of the internal clock signal starts the following two-phase sampling operation sequence:
1. Trigger the voltage comparator 120 using the clock signal Clk.
2. Open switch $S_5$.
3. Open switch $S_2$.
4. Close switch $S_4$.
5. If Dout=0 close switch $S_3$, if Dout=1 close switch $S_1$.
6. Wait for settling of the first phase samples.
7. Open switch $S_4$.
8. Open switch $S_1$ and $S_3$.
9. Close switch $S_5$.
10. Close switch $S_2$.
11. Wait for settling of the second phase samples.

The time allocated for each one of the above steps may be determined in accordance with a particular switched capacitor implementation.

The amount of charge $Q_M$ transferred into the integrating capacitor $C_f$ during such a sampling sequence is:

when Dout=0, $Q_M=V_I*C_i$;

when Dout=1, $Q_M=(V_I-V_R)*C_i$.

The amount of charge dQ taken from the input signal source $V_I$ during such a sampling sequence is:

when Dout=0, $dQ=V_I*C_i$, when Dout=1, $dQ=(V_I-V_R)*C_i$.

It is assumed that among N consecutive sampling operations in a sampling process, for $N_1$ sampling operations Dout=1 and for $N_0=(N-N_1)$ sampling operations Dout=0. Hence, in each of $N_1$ sampling operations, the reference voltage $V_R$ is supplied together with the input voltage $V_I$, and in each of $N_0$ sampling operations, the reference voltage $V_L$ (set to a ground potential in this particular example) is supplied together with the input voltage $V_I$. Therefore, the total charge $Q_{MTOT}$ transferred into the integrating capacitor $C_f$ during the set of N consecutive sampling operations is:

$$Q_{MTOT}=N_0*V_I*C_i+N_1*(V_I-V_R)*C_i=(N-N_1)*V_I*C_i+N_1*C_i*(V_I-V_R)$$

$$Q_{MTOT}=(N*V_I-N_1*V_R)*C_i.$$

The delta-sigma modulator operates so as to minimize the total charge accumulated in the integrator. Hence, within the resolution of the modulator, if $Q_{MTOT}=0$, $N_1=N*V_I/V_R$.

Hence, the ratio $N_1/N$ representing the density of "1" bits contains information on the ratio $V_I/V_R$ between the input signal and the reference signal. Therefore, the digital output data stream Dout provides this information to the switch controller 40.

Accordingly, the total charge taken from the input signal source can be calculated as:

$$dQ_{TOT}=N_0*V_I*C_i+N_1*(V_I-V_R)*C_i=(N*V_I-N_1*V_R)*C_i$$

and within the resolution of the converter if $N_1=N*V_I/V_R dQTOT=0$.

Therefore, the total charge taken from the input signal source is substantially zero.

One skilled in the art would understand that the concept of the present disclosure is also applicable to higher-order modulators that may have additional integrator stages between the output of the amplifier 110 and the input of the comparator 120.

In addition, one skilled in the art would realize that the disclosed technique is not limited to over-sampling converters producing single-bit digital data streams. It may also be applicable to converters generating multi-bit output data streams. In this case, multi-bit output data streams may be converted into multiple single bit data streams such as binary weighted or thermometer encoded streams, which may be used to control multiple equivalent weighted input signal sampling capacitors.

Further, the disclosed sampling front-end configuration with reduced average input current may be integrated with other well known delta-sigma modulators, such as MASH or band-pass modulators.

Figure 5:
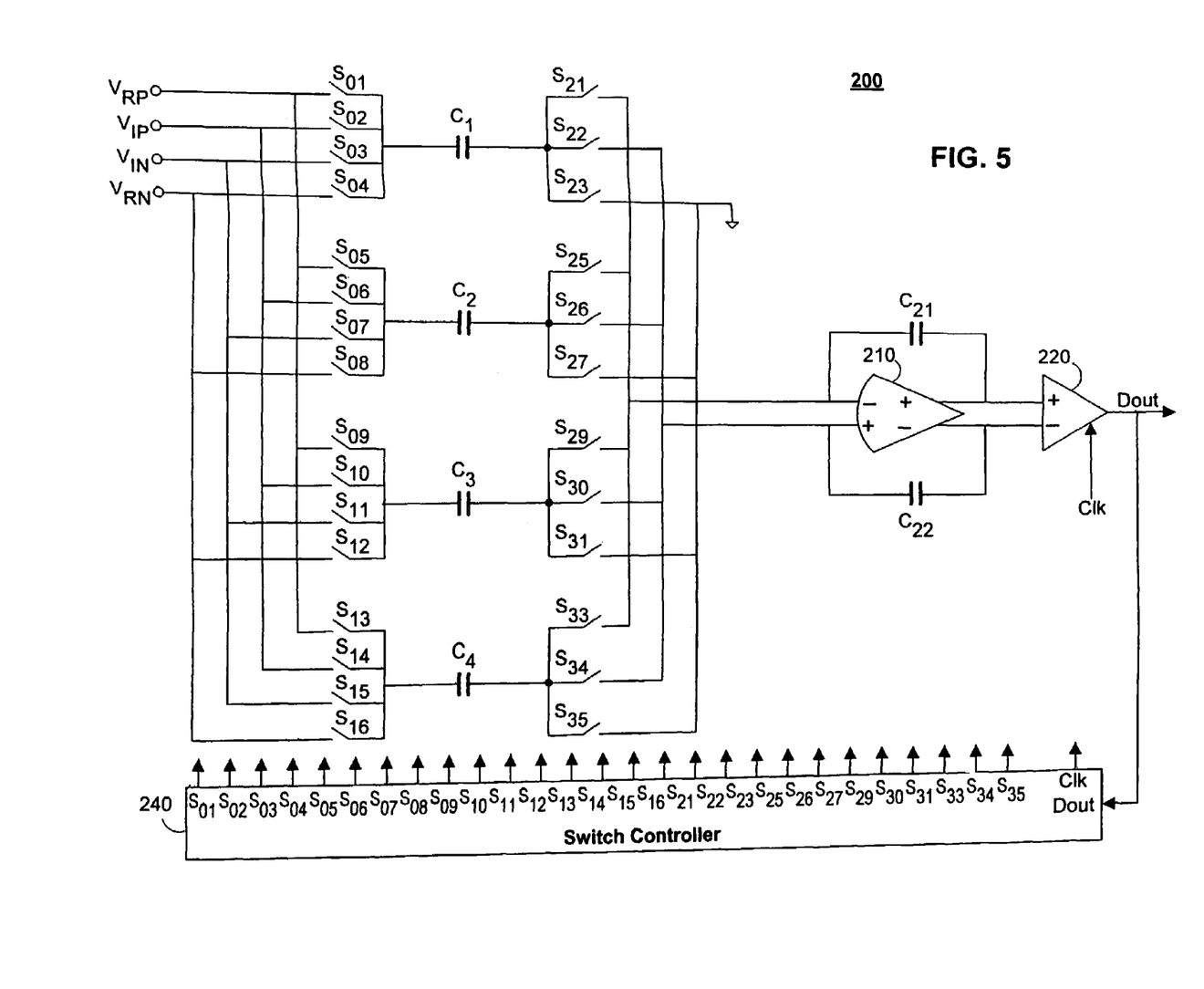
FIG. 5 is a diagram illustrating a system for sampling a differential input signal so as to reduce an average differential input current.

FIG. 5 illustrates an A/D converter 200 having a differential front-end sampling configuration that substantially reduces an average differential input current. The A/D converter 200 comprises 16 analog switches $S_{01}$ to $S_{16}$ for supplying to first terminals of 4 sampling capacitors $C_1$ to $C_4$ a differential input signal defined by voltages $V_{IP}$, $V_{IN}$, and a differential reference signal defined by voltages $V_{RP}$, $V_{RN}$. Second terminals of the sampling capacitors $C_1$ to $C_4$ are connected to a differential first-order delta-sigma modulator including 12 analog switches $S_{21}$ to $S_{35}$, a differential-in/differential-out voltage amplifier 210, integrating capacitors $C_{21}$ and $C_{22}$, and a voltage comparator 220.

The voltage amplifier 210 has a pair of inputs for supplying a differential input signal, and a pair of outputs for producing a differential output signal. Together with integrating capacitors $C_{21}$ and $C_{22}$, the voltage amplifier 210 forms a differential integrator circuit. The voltage comparator 220 is controlled by a clock signal Clk generated by a switch controller 210 to produce a one-bit digital data stream Dout. In particular, when the comparator 120 is triggered by the Clk signal, it may produce output digital value Dout=1 if the differential output of the amplifier 210 is positive, and output digital value Dout=0 if the output of the amplifier 210 is negative. The data signal Dout is used by the switch controller 240 to produce switch drive signals $S_{01}$ to $S_{16}$ and $S_{21}$ to $S_{35}$ that control the respective switches $S_{01}$ to $S_{16}$ and $S_{21}$ to $S_{35}$. A control sequence generated by the switch controller 240 using its internal clock signal provides N consecutive samples of the input differential signal while maintaining the total differential charge taken from the input signal source at a substantially zero level. Therefore, the switch controller 240 controls the sampling sequence to reduce the average input differential current of the A/D converter 200 to a substantially zero value.

Although the illustrated A/D converter 200 contains a first-order delta-sigma modulator, one skilled in the art would realize that the concept of the present disclosure is applicable to any modulator. Further, to simplify explanation of the present concept, the A/D converter 200 is shown with the input common mode voltage of the amplifier 210 set to a ground potential.

Sampling operations of the A/D converter 200 are described below. At every pulse of the internal clock signal, the switch controller 240 carries out the following sequence composed of 8 sampling phases:

1. Trigger the voltage comparator 220 using signal Clk.
2. Open switches $S_{21}$, $S_{25}$, $S_{30}$, $S_{34}$.
3. Open switches $S_{01}$, $S_{04}$, $S_{06}$, $S_{11}$, $S_{13}$, $S_{16}$.
4. Close switches $S_{23}$, $S_{27}$, $S_{31}$, $S_{35}$.
5. Close switches $S_{06}$, $S_{11}$.
  If Dout=0, close switches $S_{04}$, $S_{13}$.
  If Dout=1, close switches $S_{01}$, $S_{16}$.
6. Wait for settling of phase 1 samples.
7. Open switches $S_{23}$, $S_{27}$, $S_{31}$, $S_{35}$.
8. Open switches $S_{01}$, $S_{04}$, $S_{06}$, $S_{11}$, $S_{13}$, $S_{16}$.
9. Close switches $S_{21}$, $S_{26}$, $S_{29}$, $S_{34}$.
10. Close switches $S_{02}$, $S_{15}$.
  If Dout=0, close switches $S_{08}$, $S_{09}$.
  If Dout=1, close switches $S_{05}$, $S_{12}$.
11. Wait for settling of phase 2 samples.
12. Open switches $S_{21}$, $S_{26}$, $S_{29}$, $S_{34}$.
13. Open switches $S_{02}$, $S_{05}$, $S_{08}$, $S_{09}$, $S_{12}$, $S_{15}$.
14. Close switches $S_{23}$, $S_{27}$, $S_{31}$, $S_{35}$.
15. Close switches $S_{02}$, $S_{15}$.
  If Dout=0, close switches $S_{05}$, $S_{12}$.
  If Dout=1, close switches $S_{08}$, $S_{09}$.
16. Wait for settling of phase 3 samples.
17. Open switches $S_{23}$, $S_{27}$, $S_{31}$, $S_{35}$.
18. Open switches $S_{02}$, $S_{05}$, $S_{08}$, $S_{09}$, $S_{12}$, $S_{15}$.
19. Close switches $S_{22}$, $S_{26}$, $S_{29}$, $S_{33}$.
20. Close switches $S_{07}$, $S_{10}$.
  If Dout=0, close switches $S_{04}$, $S_{13}$.
  If Dout=1, close switches $S_{01}$, $S_{16}$.
21. Wait for settling of phase 4 samples.
22. Open switches $S_{22}$, $S_{26}$, $S_{29}$, $S_{33}$.
23. Open switches $S_{01}$, $S_{04}$, $S_{07}$, $S_{10}$, $S_{13}$, $S_{16}$.
24. Close switches $S_{23}$, $S_{27}$, $S_{31}$, $S_{35}$.
25. Close switches $S_{07}$, $S_{10}$.
  If Dout=0, close switches $S_{01}$, $S_{16}$.
  If Dout=1, close switches $S_{04}$, $S_{13}$.
26. Wait for settling of phase 5 samples.
27. Open switches $S_{23}$, $S_{27}$, $S_{31}$, $S_{35}$.
28. Open switches $S_{01}$, $S_{04}$, $S_{07}$, $S_{10}$, $S_{13}$, $S_{16}$.
29. Close switches $S_{22}$, $S_{25}$, $S_{30}$, $S_{33}$.
30. Close switches $S_{03}$, $S_{14}$.
  If Dout=0, close switches $S_{05}$, $S_{12}$.
  If Dout=1, close switches $S_{08}$, $S_{09}$.
31. Wait for settling of phase 6 samples.
32. Open switches $S_{22}$, $S_{25}$, $S_{30}$, $S_{33}$.
33. Open switches $S_{03}$, $S_{05}$, $S_{08}$, $S_{09}$, $S_{12}$, $S_{14}$.
34. Close switches $S_{23}$, $S_{27}$, $S_{31}$, $S_{35}$.
35. Close switches $S_{03}$, $S_{14}$.
  If Dout=0, close switches $S_{08}$, $S_{09}$.

If Dout=1, close switches $S_{05}$, $S_{12}$.
36. Wait for settling of phase 7 samples.
37. Open switches $S_{23}$, $S_{27}$, $S_{31}$, $S_{35}$.
38. Open switches $S_{03}$, $S_{05}$, $S_{08}$, $S_{09}$, $S_{12}$, $S_{14}$.
39. Close switches $S_{21}$, $S_{25}$, $S_{30}$, $S_{34}$.
40. Close switches $S_{06}$, $S_{11}$.
If Dout=0, close switches $S_{01}$, $S_{16}$.
If Dout=1, close switches $S_{04}$, $S_{13}$.
41. Wait for settling of phase 8 samples.

The time allocated for each one of the above steps is determined in accordance with a particular switched capacitor implementation.

The amount of differential charge $Q_D$ transferred into the integrator presented above is:

if Dout=0, $Q_D=-2*(C_1+C_2+C_3+C_4)*[(V_{IP}-V_{IN})+(V_{RP}-V_{RN})]$;

if Dout=1, $Q_D=-2*(C_1+C_2+C_3+C_4)*[(V_{IP}-V_{IN})-(V_{RP}-V_{RN})]$.

If:

$Ceq=C_1+C_2+C_3+C_4$, $V=V_{IP}-V_{IN}$, $R=V_{RP}-V_{RN}$;

Then:

if Dout=0, $Q_D=2*Ceq*(-R-V)$, if Dout=1, $Q_D=2*Ceq*(R-V)$.

The total amount of charge $dQ_P$ taken from the input signal source positive terminal $V_{IP}$ during the sampling sequence is:

if Dout=0, $dQ_P=Ceq*(V_{IP}-V_{RN})$, if Dout=1, $dQ_P=Ceq*(V_{IP}-V_{RP})$.

The total amount of charge $dQ_N$ taken from the input signal source negative terminal $V_{IN}$ during the sampling sequence is:

if Dout=0, $dQ_N=Ceq*(V_{IN}-V_{RP})$, if Dout=1, $dQ_N=Ceq*(V_{IN}-V_{RN})$.

It can be assumed that a set of N consecutive sampling operations representing one conversion cycle comprises $N_1$ operations for which Dout=1, and $N_0=(N-N_1)$ operations for which Dout=0. Thus, the total differential charge transferred into the integrator during the N consecutive sample operations is:

$Q_{DTOT}=2*Ceq*[N_1*(R-V)+(N-N_1)*(-R-V)]$

Since the modulator control loop operates so as to minimize the charge accumulated by the integrator, within the resolution of the system, it can be stated that:

if $Q_{DTOT}=0$, $N_1=0.5*N*(1+V/R)=0.5*N*[1+(V_{IP}-V_{IN})/(V_{RP}-V_{RN})]$.

This relation shows that the $N_1/N$ ratio representing the density of "1" bits contains information about the ratio V/R between the differential input signal and the differential reference signal. The digital output data stream Dout provides this information to the switch controller 240 for producing proper switch drive signals. The total charge $dQ_{PTOT}$ taken from the input signal source positive terminal $V_{IP}$ during a set of N consecutive sample operations is equal to:

$dQ_{PTOT}=Ceq*[N*V_{IP}-N_1*V_{RP}-(N-N_1)*V_{RN}]$ $dQ_{PTOT}=Ceq*0.5*N*[(V_{IP}+V_{IN})-(V_{RP}+V_{RN})]$.

Similarly, the total charge $dQ_{NTOT}$ taken from the input signal source negative terminal $V_{IN}$ during a set of N consecutive sample operations is equal to:

$dQ_{NTOT}=Ceq*[N*V_{IN}-N_1*V_{RN}-(N-N_1)*V_{RP}]$ $dQ_{NTOT}=Ceq*0.5*N*[(V_{IP}+V_{IN})-(V_{RP}+V_{RN})]$.

Since $dQ_{PTOT}=dQ_{NTOT}$, the average differential current taken from the input signal source including a set of N consecutive sample operations is zero within the resolution of the system. Hence, the switch controller 240 controls the sampling procedure to make $dQ_{PTOT}=dQ_{NTOT}$. Accordingly, the sampling technique of the present disclosure reduces the average input differential current of the A/D converter 200 to a zero level.

One skilled in the art would realize that the disclosed sampling configuration may be used not only with single-bit output data streams Dout but also with multi-bit output data streams, and may be integrated with higher-order modulators by inserting additional integrator stages between the output of the differential integrator 210 and the input of the comparator 220. Further, the disclosed system for reducing an average input differential current may also be implemented using other delta-sigma modulators such as MASH modulators.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A method of sampling an analog input signal, the analog input signal being provided by an input signal source, the method comprising:
   using a sampling device to perform a set of sampling operations on the analog signal, a first reference signal, and a second reference signal; and
   generating a set of connection sequences using a switch controller, the set of connection sequences being based on the magnitude of the analog signal with respect to the magnitude of the first reference signal and the magnitude of the second reference signal, respectively, the set of connection sequences that implements the set of sampling operations wherein the set of sampling operations draw substantially zero average current from the analog input source.

2. The method of claim 1, wherein the analog input signal comprises a magnitude greater than the magnitude of the first reference signal and smaller than the magnitude of the second reference signal.

3. A method of sampling a differential analog input signal, the differential analog input signal being provided by an input signal source, the method comprising:

using a sampling device to sample the differential analog signal and a reference signal; and generating a set of connection sequences using a switch controller, the set of connection sequences being based on the magnitude of the differential analog signal with respect to the magnitude of the reference signal, the set of connection sequences that controls the operation of the sampling device wherein the sampling device draws substantially zero average current from the input signal source.

4. The method of claim 3, wherein the differential analog input signal comprises a magnitude smaller than the magnitude of the reference signal.

5. A method of sampling an analog input signal, the analog input signal being provided by an input signal source, the method comprising:

using a sampling device to perform a first set of sampling operations on the analog signal and a first reference signal;

using the sampling device to perform a second set of sampling operations, the second set of sampling operations that samples the analog input signal and a second reference signal; and generating a set of connection sequences using a switch controller, the set of connection sequences being based on the magnitude of the analog signal with respect to the magnitude of the first reference signal and the magnitude of the second reference signal, respectively, the set of connection sequences that implements the first set of sampling operations and the second set of sampling operations wherein the first set of sampling operations and the second set of sampling operations collectively draw substantially zero average current from the analog input source.

6. The method of claim 5, wherein the analog input signal comprises a magnitude greater than the magnitude of the first reference signal and smaller than the magnitude of the second reference signal.

7. A method of sampling a differential analog input signal, the differential analog input signal being provided by an input signal source, the method comprising:

using a sampling device to perform a set of sampling operations on the differential analog signal and a reference signal; and generating a set of connection sequences using a switch controller, the set of connection sequences being based on the magnitude of the differential analog signal with respect to the magnitude of the reference signal, the set of connection sequences that implements the set of sampling operations wherein the set of sampling operations draws substantially zero average current from the analog input source.

8. The method of claim 7, wherein the differential analog input signal comprises a magnitude smaller than the magnitude of the reference signal.

\* \* \* \* \*